United States Patent
Kinzer

[11] Patent Number: 6,043,126
[45] Date of Patent: Mar. 28, 2000

[54] PROCESS FOR MANUFACTURE OF MOS GATED DEVICE WITH SELF ALIGNED CELLS

[75] Inventor: Daniel M. Kinzer, El Segundo, Calif.

[73] Assignee: International Rectifier Corporation, El Segundo, Calif.

[21] Appl. No.: 08/956,062

[22] Filed: Oct. 22, 1997

Related U.S. Application Data

[60] Provisional application No. 60/029,491, Oct. 25, 1996.

[51] Int. Cl.[7] .................................................. H01L 21/336
[52] U.S. Cl. ......................... 438/273; 438/268; 438/270; 438/138; 438/527
[58] Field of Search .................................... 438/299, 268, 438/270, 273, 274, 303, 305, 589, 138, 527, 529; 148/DIG. 126

[56] References Cited

U.S. PATENT DOCUMENTS

| | | | |
|---|---|---|---|
| 4,757,025 | 7/1988 | Bender | 438/137 |
| 4,879,254 | 11/1989 | Tsuzuki et al. | 438/273 |
| 4,960,723 | 10/1990 | Davies | 438/274 |
| 5,040,045 | 8/1991 | McArthur et al. | 257/341 |
| 5,155,052 | 10/1992 | Davies | 438/268 |
| 5,173,435 | 12/1992 | Harada | 438/138 |
| 5,234,851 | 8/1993 | Korman et al. | 438/273 |
| 5,304,837 | 4/1994 | Hierold | 257/341 |
| 5,342,797 | 8/1994 | Sapp et al. | 438/305 |
| 5,404,040 | 4/1995 | Hshieh et al. | 438/586 |
| 5,426,320 | 6/1995 | Zambrano | 257/362 |
| 5,602,055 | 2/1997 | Nicholls et al. | 438/586 |
| 5,631,187 | 5/1997 | Phipps et al. | 438/237 |
| 5,631,484 | 5/1997 | Tsoi et al. | 438/756 |
| 5,677,562 | 10/1997 | Korwin-Pawlowski et al. | 257/490 |

FOREIGN PATENT DOCUMENTS

| | | |
|---|---|---|
| 0272755 | of 1988 | European Pat. Off. . |
| 0342952 | of 1989 | European Pat. Off. . |
| 0437939 | of 1991 | European Pat. Off. . |
| 2119184 | of 1990 | Japan . |

*Primary Examiner*—Michael Trinh
*Attorney, Agent, or Firm*—Ostrolenk, Faber, Gerb & Soffen, LLP

[57] ABSTRACT

An MOS-gated power semiconductor device is formed by a process in which a self-aligned device cell is formed without any critical alignments. A sidewall spacer is used to mask the etching of a depression in the silicon to reduce the number of critical alignment steps. An optional selectively formed metal connects the polysilicon layer to the P+ and N+ diffusion regions. The sidewall spacer, in combination with the selectively formed metal, prevents impurities from diffusing to the parasitic DMOS channels and inverting them to cause leakage. A termination structure may also be formed by this process.

20 Claims, 5 Drawing Sheets

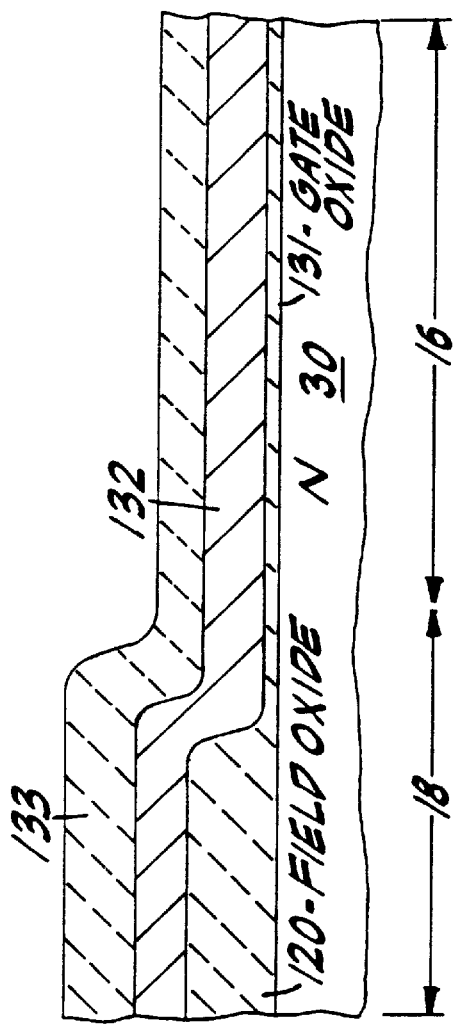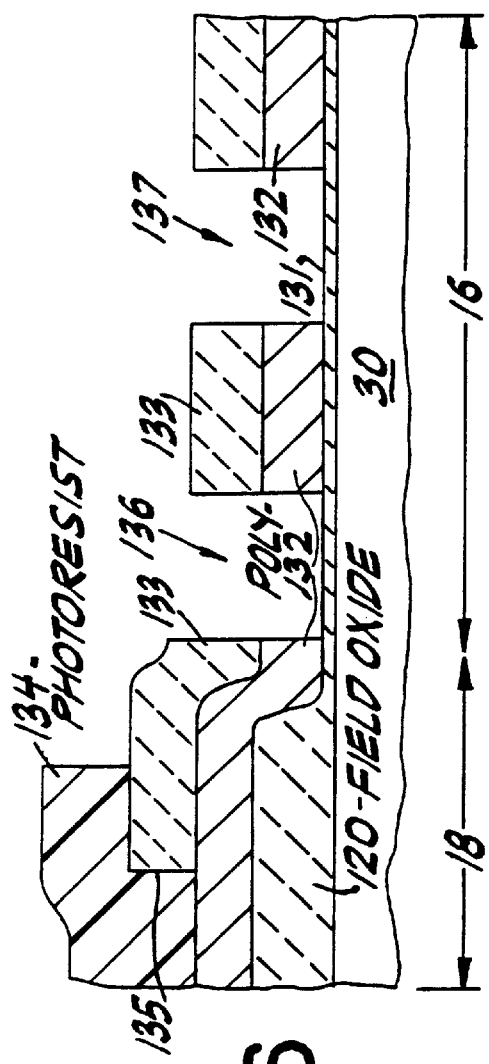

PROCESS FOR MANUFACTURE OF MOS GATED DEVICE WITH SELF ALIGNED CELLS

This application claims benefit of Provisional Appl. No. 60/029,491 filed Oct. 25, 1996.

BACKGROUND OF THE INVENTION

The present invention relates to semiconductor devices and, more specifically, to MOS gate controlled reference (MOS-gated) semiconductor devices formed using a reduced number of masking steps with no critical alignment.

MOS-gated devices are well-known in the art and include devices such as the MOS-gated devices described in U.S. patent application Ser. No. 08/299,533, filed Sep. 1, 1994 (IR-1113), U.S. Pat. No. 5,795,793, which is incorporated herein by reference. These devices include power MOSFETs, MOS-gated thyristors, insulated gate bipolar transistors (IGBTs), gate turn-off devices and the like.

The manufacturing processes for such devices typically include a number of lithographic masking steps which include critical mask alignment steps. Each of these critical alignment steps add manufacturing time and expense as well as provide possible sources of device defects.

It is therefore desirable to minimize or eliminate the number of critical alignments necessary as well as reduce the number of masking steps to improve the manufacturing yield and reduce the manufacturing cost.

SUMMARY OF THE INVENTION

The present invention provides a novel process for the manufacture of an MOS-gated power device by forming a self-aligned device cell without any critical alignments.

In accordance with the invention, a semiconductor device is fabricated by forming a layer of gate insulation material atop a silicon substrate of one conductivity type. A layer of polysilicon is deposited atop the layer of gate insulation material. A first overlaying insulation layer is deposited or thermally grown, and selected regions are patterned and etched away to form a spaced openings therein which expose underlying regions of the layer of polysilicon. The underlying regions of the layer of polysilicon are etched away to form spaced openings. Impurities of another conductivity type are introduced into the surface regions of the silicon substrate that are located beneath the openings in the layer of polysilicon and form first diffused regions. Impurities of the one conductivity type are introduced into the surface regions of the silicon substrate and form second diffused regions. A second overlaying insulation layer is deposited, and a portion of the second layer that is atop the first overlaying insulation layer is etched away to leave a remaining portion that forms vertical sidewall spacers along the sidewalls in each of the openings in the first overlaying insulation layer and in the layer of polysilicon and which exposes a portion of each of the surface regions of the silicon substrate. Depressions are etched in the exposed portion of the surface region of the silicon substrate to a depth greater than the second diffused regions. Impurities of the another conductivity type are introduced into the portion of the surface regions of the silicon substrate to form third diffused regions. The second diffused regions have a final depth that is less than that of the third diffused regions. Alternatively, the third diffused regions are formed prior to depositing the second overlaying insulation layer. The first diffused regions are deeper and wider than and have a lower concentration than that of the third diffused regions.

A contact conductive layer is deposited, and portions of this layer are patterned and etched away to form at least one source contact which contacts the second and third diffused regions and at least one gate contact.

Another conductive layer may be deposited and thermally treated such that portions of the layer that contact the second and third diffused regions to form a metal silicide layer that provides an electrical connection between the second and third diffused regions. Unreacted portions of this layer are removed.

A portion of the vertical sidewall spacers of the second overlaying insulation layer and a portion of the first overlaying insulation layer may be etched away prior to depositing the another conductive layer, and the thermal treatment of this conductive layer thus forms further portions of the metal silicide layer that contact the polysilicon layer and which provide an electrical connection between the polysilicon layer and the second and third diffused regions.

Impurities may be introduced by implanting the impurities into the silicon substrate through a layer of gate insulation material and then driving in the impurities. The one conductivity type may be N-type, and the other conductivity type may be P-type. The first overlaying insulation layers may be a thermally grown oxide layer, and the second overlaying layer may be a TEOS layer.

The another conductive layer may be titanium or may be tungsten. This conductive layer may be rapidly thermal annealed at about 800° C. or may be rapid thermal annealed first at about 600° C. and then at about 800° C. Selected regions of the polysilicon layer may be patterned and etched away to form polysilicon diodes, and impurities of the one conductivity type may be introduced into the polysilicon layer.

A layer of field insulation material may be formed atop a silicon substrate in which at least one selected region is patterned and is etched away to form at least one opening and at least one remaining portion. The layer of gate insulation material may thus be formed atop of silicon substrate in the opening, and the layer of polysilicon may likewise be formed atop the field insulation and gate insulation materials. Selected regions of the first overlaying insulation layer may be patterned and etched away to form first space openings which expose underlying regions of the layer of polysilicon that are atop the layer of gate insulation material and second spaced openings which expose underlying regions of the polysilicon layer which are atop the field insulation material. The first underlying regions of the polysilicon layer may be etched away to form further spaced openings, and the impurities may then be introduced into the surface regions of the silicon substrate that are located beneath the further openings to form the first diffused regions.

The another conductive layer may be titanium or tungsten and may be rapid thermal annealed. The contact conductive layer may include a solderable contact metal deposited atop the second conductive layer, and the solderable contact metal may include a trimetal that includes respective layers of titanium, nickel and silver. A gate bus may be formed that contacts a portion of the layer polysilicon as atop the layer of gate insulation material. The field insulation material may include a second opening that borders the semiconductor device and forms a street region, and the polysilicon layer may include one or more polysilicon rings that are located atop the field insulation material between the gate bus and the street region.

In accordance with another aspect of the invention, a semiconductor device has the structure formed in the above manner.

The critical alignments steps are eliminated by using a low temperature oxide side wall spacer to mask the etching of a depression in the silicon and using a selectively formed metal to connect the polysilicon layer to the N+ and P+ diffusion regions. The low temperature oxide side wall spacer, in combination with the selectively formed metal layer, provides a structure that prevents impurities from diffusing to the parasitic DMOS device channels and inverting them to cause leakage.

Other features and advantages of the present invention will become apparent from the following description of the invention which refers to the accompanying drawings.

BRIEF DESCRIPTION OF THE DRAWINGS

FIG. 5 is a cross sectional view of another embodiment of the present invention showing a portion of a chip after a field oxide layer has been formed thereon and patterned, and after the subsequent deposition of a gate oxide layer, a polysilicon layer and a low temperature oxide layer;

FIG. 6 shows the structure of FIG. 5 after the patterning and etching of the low temperature oxide and polysilicon layers;

DETAILED DESCRIPTION OF THE INVENTION

The following description of the preferred embodiments of the invention describes the manufacture of an N channel power MOSFET device. However, the present invention is also applicable to the manufacture of a P channel power MOSFET device. Furthermore, any suitable modification to the junctions can be employed to use the same process for the manufacture of other MOS-gated devices, such as an IGBT or a MOS-gated thyristor, regardless of whether the device is N channel or P channel.

The topology of the devices is preferably that of hexagonal cells. However, it will be apparent to those skilled in the art that the process is equally applicable to cells having any polygonal structure such as square or rectangular cells, whether offset or in a line, as well as to interdigitated structures.

Figure 1:
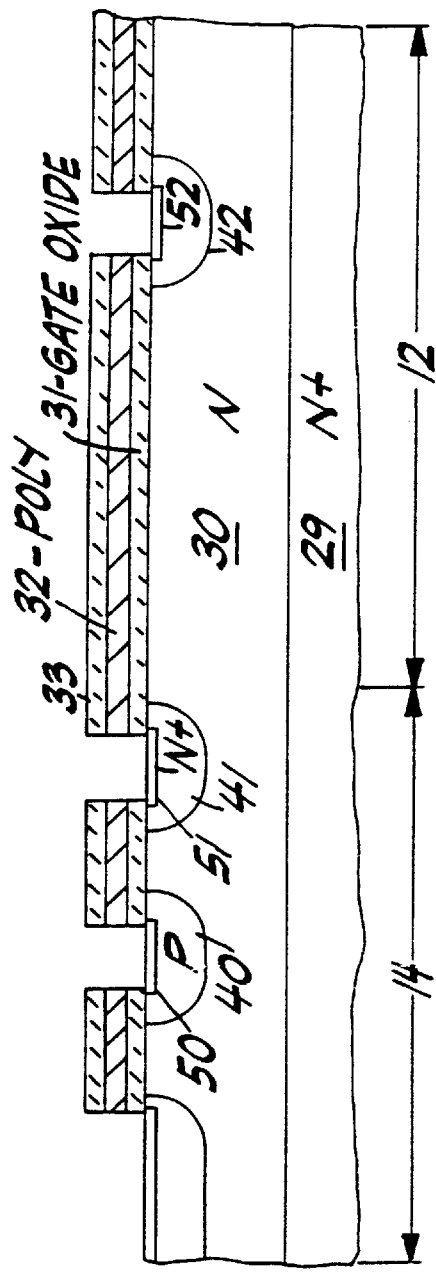
FIG. 1 is a cross-sectional view of a portion of a chip within a silicon wafer after a gate oxide layer, a polysilicon layer and a low temperature oxide layer have been formed thereon, after openings have been formed in these layers, and after lightly doped P regions and N+ regions have been formed in the openings.

Referring first to FIG. 1, there is shown a portion of a wafer or chip showing a first embodiment of a device region 12 of the invention which has a repetitive structure. Also shown is a first example of a termination region 14. However, alternative examples of termination regions may be incorporated in place of region 14 as described herein. Only a few of the elements are shown in cross-section. The wafer may be of any desired size and will be diced into a plurality of chips. In this description, the terms "chip" and "wafer" are sometimes interchanged.

FIG. 1 shows a wafer having an N− body 30 formed of monocrystalline silicon. Preferably, the N− body 30 is an epitaxially formed layer grown atop an N+ substrate 29. A drain (or anode) contact may be connected to the N+ substrate and may be available for connection at either surface of the chip.

The first step in the process of the invention is the formation of an insulation layer 31 atop the N− body 30. The insulation layer 31 may be thermally grown silicon dioxide and may have a thickness of approximately 250 angstroms.

A layer of polysilicon 32 is then deposited atop the oxide layer 31 and has a thickness, for example, of 3500 angstroms. The polysilicon layer may be formed in any desired manner but, preferably, is deposited and then heavily doped with implanted arsenic or by a subsequent CVD doping step such as by introducing $POCl_3$ into the polysilicon.

Thereafter, a first overlying oxide layer 33 is formed atop the polysilicon layer 32 at a thickness of, preferably, 7000 angstroms. Preferably, the first overlying oxide layer is comprised of a thermally grown oxide layer that is grown atop the polysilicon. However, other materials such as low temperature oxide (LTO), plasma-enhanced chemical vapor deposited (PECVD) oxide, PECVD TEOS, or furnace deposited TEOS may be used instead. Further, the layer may be phosphorus doped.

After the deposition of the first overlying oxide layer 33, a suitable photoresist layer (not shown) is then formed atop the first overlying oxide layer and patterned by an appropriate photolithographic mask step to form openings in the photoresist to the surface of the first overlying layer. An anisotropic oxide etch then forms an opening that reaches the polysilicon layer 32. The polysilicon layer is then etched by a subsequent anisotropic etch which forms corresponding openings down to the gate oxide layer. Preferably, the first oxide and polysilicon side walls should be as nearly vertical as possible to accurately define the subsequent implant steps.

Thereafter, the underlying exposed gate oxide layer 31 may be removed using an isotropic wet etch or with an anisotropic plasma etch. However, it is also possible to leave the gate oxide layer intact at this step and then subsequently implant ions at a sufficiently high energy that penetrates the thin gate oxide.

The above anisotropic and isotropic etches used are well-known to those of ordinary skill in the art and any appropriate etch process can be selected for these steps.

Thereafter, the photoresist layer is stripped, and a 7.5E13 boron implant is carried out at an energy of 80 KeV through the openings in the first overlying layer and polysilicon layers and into the exposed silicon. Following the implant, the P type boron implants are driven in at approximately 1175° C. for about 30 minutes, preferably, to form channel regions 42 and termination regions 40 and 41.

A relatively high N+ dose of 3E15 arsenic or phosphorous, for example, is then implanted through the openings in the overlying oxide/polysilicon layers at an energy of about 120 keV to subsequently form the N+ regions 50, 51 and 52. A diffusion step may then follow.

Thereafter, a second overlying oxide layer is formed atop the surface of the wafer of FIG. 1 at a thickness of about 7000 angstroms. Preferably, the second overlying oxide layer is comprised of furnace deposited TEOS. However, other materials such as LTO, PECVD oxide or PECVD TEOS may be used. Further, the layer may be phosphorus doped.

Figure 2:
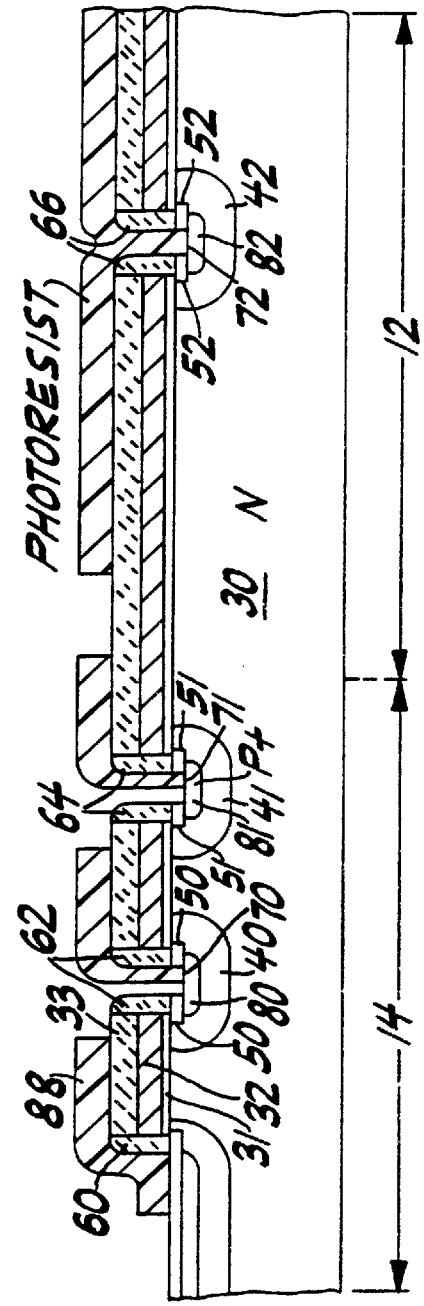
FIG. 2 shows the structure of FIG. 1 after the deposition and etching of a further low temperature oxide layer to form sidewall spacers, an anisotropic silicon etch to form a depression through the N+ region, and the formation of a P+ region in the openings followed by the deposition and patterning of a photoresist layer.

The second overlying layer is then plasma etched so that substantially all of the second overlying layer that was deposited atop the horizontal surfaces are removed, leaving only vertical side wall spacers 60, 62, 64, 66 which have a thickness of about 3000 angstroms, as shown in FIG. 2. Then, another anisotropic etch etches into the exposed silicon surface so that holes 70, 71 and 72 are formed that penetrate the N+ regions 50, 51 and 52 and that reach the P regions 40, 41 and 42. Because of the vertical sidewall spacers, the holes or depressions formed in the silicon surface have a smaller diameter than that of the openings in the polysilicon and first overlying oxide layers. The holes are preferably etched to a depth of about 500 to 1000 angstroms.

Thereafter, a 3E15 dose of boron is implanted into the silicon substrate exposed by the etching of the holes to form heavily doped regions 80, 81 and 82 in the P type regions 40, 41 and 42. The implant is carried out at an energy of about 80 keV. Alternatively, and preferably, the boron implant is performed prior to the deposition of the second overlying oxide layer at which time the regions 80, 81 and 82 are formed.

A second photoresist layer 88 is then applied atop the surface of the wafer and is patterned by a second photolithographic step to expose portions of first overlying layer 33 and a portion of sidewall spacers 60, 62, 64, surround the holes 70, 71 and 72 formed in the silicon surface, as shown in FIG. 2. In accordance with an important aspect of the present invention, the source, base and channel regions of the device are previously defined before this step, and therefore the alignment of the second photolithographic step to the wafer is not critical. As FIG. 2 shows, the alignment tolerance of the second photolithographic step may, in any specific direction, be as large as the separation distance between the walls of a respective sidewall spacer.

Figure 3:
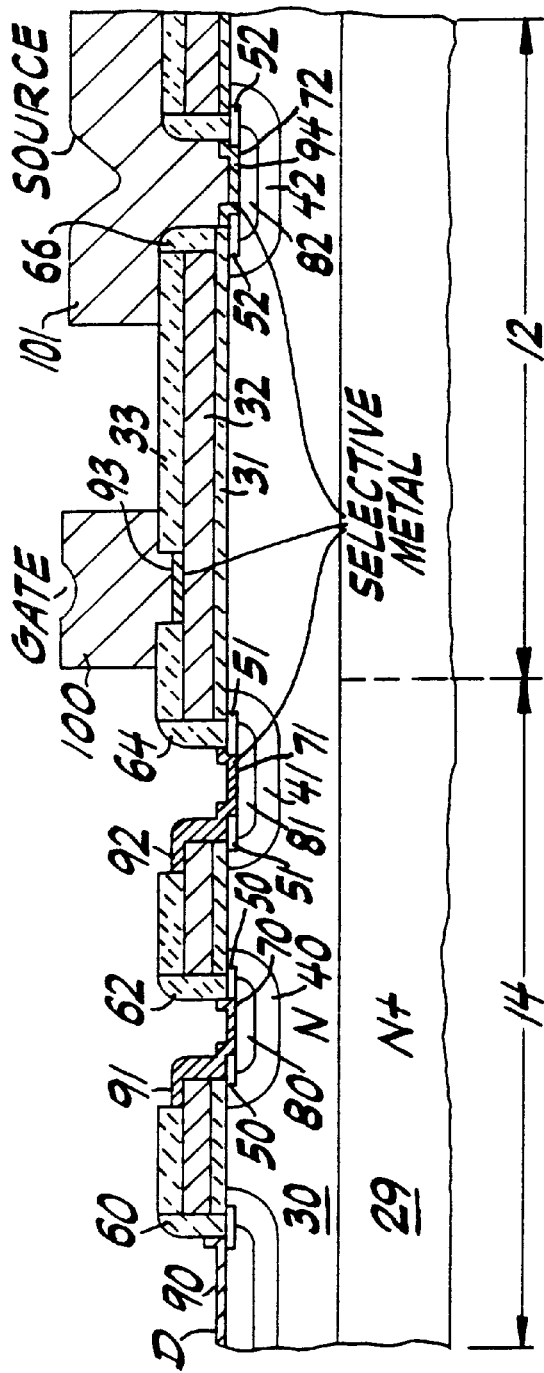
FIG. 3 shows the structure of FIG. 2 after removing portions of the low temperature oxide layer and side wall spacers, formation of an optional selective metal layer, and the subsequent deposition and etching of an aluminum layer.

After the formation of the openings in the photoresist, the exposed portions of the first overlying layer and the exposed portions of the sidewall spacers are removed by an anisotropic oxide etch to expose contact regions in the N+ regions 50 and 51 and N+ sources 52, as shown in FIG. 3.

The N+ and P+ implants are then driven in, preferably at a temperature of 975° C. for 30 minutes in a nitrogen atmosphere. The N+ regions 50, 51 and 52 will be shallower than the P+ regions 80, 81 and 82 by an amount selected by the designer and determined by the species and doses used.

When the termination region 14 is included, and in accordance with another aspect of the present invention, a layer of titanium is deposited atop the surface of the wafer. The wafer is then subject to rapid thermal annealing (RTA) so that the portions of the titanium metal layer that contact the N+ and P+ regions of the silicon substrate or that contact the polysilicon layer will react with the silicon to form titanium silicide. The RTA step may be carried out at about 800° C. or may be carried out in a two-step process in which a 600° C. anneal is followed by an 800° C. anneal.

The titanium silicide layer serves to improve the contact resistance to the N+ and P+ regions 50, 51 and 80, 81 and thereby reduces the device on-resistance, improves the breakdown voltage, and increases the current handling capacity of the device. The titanium silicide layer also serves as a barrier to aluminum migration in the device.

Thereafter, the unreacted portions of the titanium layer are removed using a selective wet etch, such as in a $H_2SO_4$/$H_2O_2$ solution, which leaves the titanium silicide contact regions 90, 91 and 92 shown in FIG. 3. The titanium silicide layer connects the P+ regions 70, 71 to the N+ regions 50, 51 which forms an intentional short between the P+ and N+ regions in the termination region 14. The titanium silicide layer also connects the polysilicon layer 32 to the P+ and N+ regions.

The titanium layer is also deposited atop the device region 12. The wafer is then processed as described above to form further titanium silicide contact regions 93 and 94, shown in FIG. 3. The silicide contact regions 93 and 94, however, are not required for the operation of the device region 12 and may be omitted, as described above.

A source contact metal, such as aluminum, is then deposited over the surface of the wafer. A further photoresist layer (not shown) is then applied atop the contact metal layer and is patterned by a photolithographic step to define the gate bus 100 and the source contact 101. The alignment of this photolithographic step to the wafer is also not critical. After the photoresist layer is patterned, the contact metal layer then etched by an anisotropic etch to form gate bus 100 and source contact 101, shown in FIG. 3.

A drain (or anode) contact (not shown) may be connected to the bottom surface of the N+ substrate 29 and may be available for connection at either surface of the chip. If the device is an IGBT, a thin N+ buffer layer and P+ bottom layer are also present at the bottom surface of the wafer.

Figure 4:
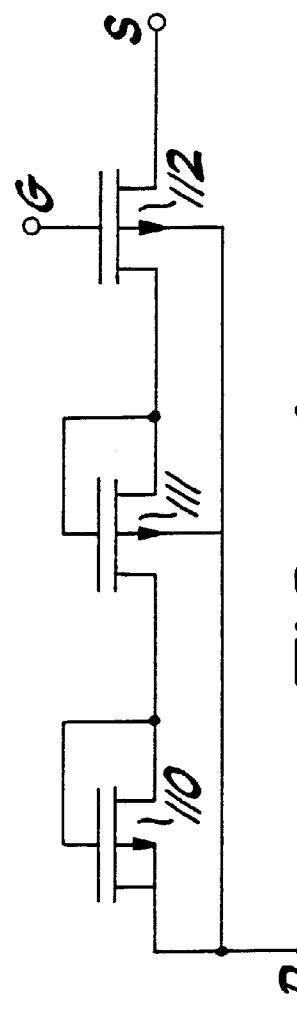
FIG. 4 shows an equivalent termination circuit formed of the structure shown in FIG. 3.

FIG. 4 shows the equivalent circuit of the termination region 14 in FIG. 3. A drain contact is made to the N+ substrate 29 and to titanium silicide segment 90, which are shown in FIG. 3, to connect the substrates of termination devices 110, 111 and 112 and the drain of device 110.

The source terminal shown in FIG. 4 represents the source aluminum contact 101 shown in FIG. 3, and the gate terminal shown in FIG. 4 represents the gate bus 100 shown in FIG. 3. It should be noted that the titanium silicide segment 92 shown in FIG. 3 connects the drain of device 112 to the source and gate of device 111 shown in FIG. 4. Titanium silicide segment 91 shown in FIG. 3 connects the drain of device 111 to the source and gate of device 110 shown in FIG. 4.

A further aspect of the invention, showing a wafer having an alternative device region 16 and an alternative termination region 18 is shown in FIG. 5. It should be noted that the termination region 18 may be incorporated with the device 12 of FIG. 3 in place of termination region 14. Similarly, the termination region 14 of FIG. 3 may be incorporated with the device region 16 of FIG. 5.

A field oxide layer 120, shown in FIG. 5, is formed atop the N− body 30 prior to the formation of a gate oxide layer. A photoresist layer is deposited atop the field oxide and then patterned as a first photolithographic mask step to form openings in the field oxide layer. The exposed portions of the field oxide are then etched away to expose the active device areas. The gate oxide insulation layer 131 is then grown atop the active device areas, and the polysilicon layer 132 and the first overlying oxide layer 133 are then formed over the gate oxide and field oxide layers in the manner described above.

The device may then be processed in a manner similar to that described above.

As FIG. 6 shows, a second photoresist layer (not shown) may then be formed atop the first overlying oxide layer 133 and patterned by an appropriate photolithographic mask step to form openings to the surface of the first overlying layer. The exposed portion of the first overlying oxide layer is then etched to form corresponding openings 136 and 137 in the first overlying oxide layer that expose portions of the polysilicon layer.

In accordance with this aspect of the present invention, a third photoresist layer 134 is deposited atop the surface of the wafer and patterned to expose the active device areas. The alignment of the third photoresist layer to the wafer is not critical. The exposed portions of the polysilicon layer that are atop the active device areas 16 are then etched down to the gate oxide layer. However, the polysilicon layer is masked by the first overlying oxide layer, rather than by the second photoresist layer. The photoresist layer merely serves to prevent the etching of the regions of the polysilicon layer atop the field oxide, as shown in FIG. 6. The photoresist layer is then stripped.

Figure 7:
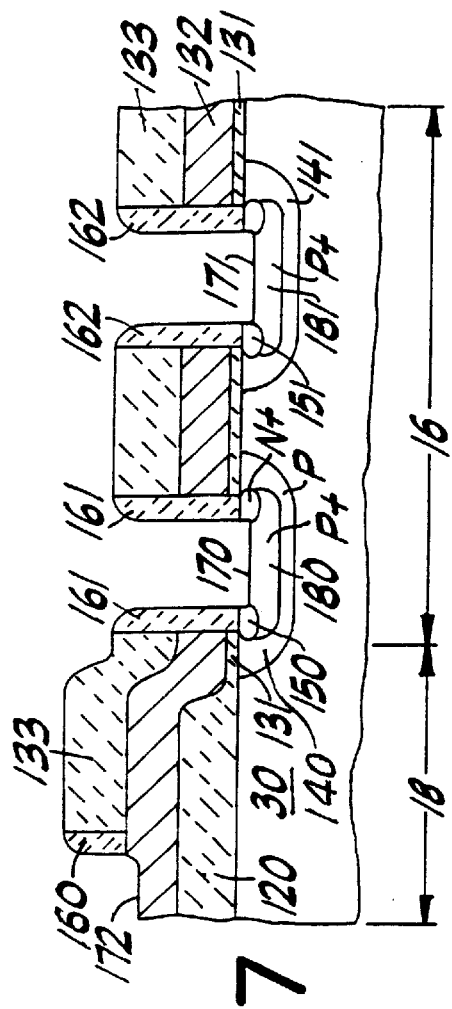
FIG. 7 shows the structure of FIG. 6 after the formation of lightly doped P regions and N+ and P+ regions, and after the subsequent formation of sidewall spacers.

Thereafter, as shown in FIG. 7, the P type channel implant regions 140 and 141 are implanted and driven in the manner described above. Then, as is also described above, the N+ source implant is introduced through the openings in the polysilicon and first overlying oxide layers and may then be driven in.

In this embodiment, however, the P+ boron base implant is then introduced at a lower 1E15 dose to form regions 180, 181 shown in FIG. 7. Thereafter, the second overlying oxide layer is then formed atop the surface of the wafer and is then etched, as described above, to form sidewall spacer 160 in the termination region 18 and spacers 161 and 162 in the device region 16 sidewall spacer 160. This deposition may be of sufficient temperature and time to drive in the P+ implant. Alternatively, the P+ (and N+) implants may then be driven at a temperature of 900° C. to form shallow source and base regions. Typically, the source region is approximately 0.2 microns deep.

Figure 8:
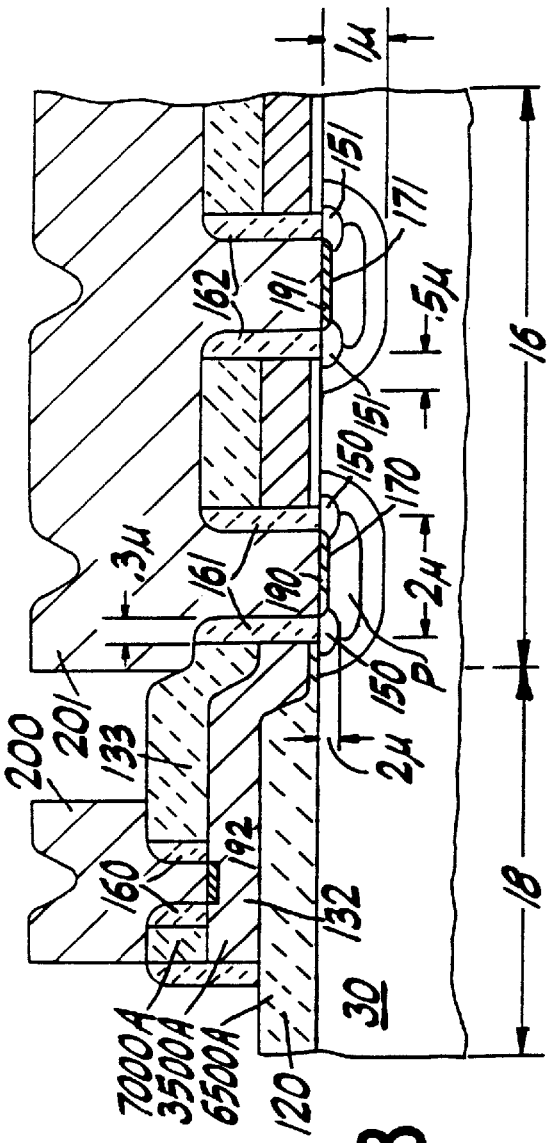
FIG. 8 shows the structure of FIG. 7 after the formation of a selective metal plug and the subsequent deposition and etching of an aluminum layer.

Thereafter, as FIG. 8 shows, depressions 170, 171 and 172 are anisotropically etched through the N+ layers to reach the P+ base layer, as described above.

Then, an optional titanium layer may be deposited in the manner described above and then annealed to form titanium silicide plugs 190, 191 and 192 inside depressions 170, 171. In this embodiment, the entirety of each of the sidewall spacers 160, 161, 162 are left intact so that the silicide is formed only in the depressions. The unreacted portions of the titanium are then removed, as is also described above. Alternatively, tungsten is selectively deposited atop the exposed silicon and polysilicon areas and then annealed to form tungsten silicide plugs.

As an alternative to the above process steps, the second photoresist layer is patterned to form openings in the device region 16 but not in the termination region 18, so that the subsequent oxide etch forms openings 136 and 137 but not openings 135. The deposition of the third photoresist is not carried out at this time. Instead, the exposed portions of the polysilicon layer in device region 16 are etched. Then, the P-type channel implant, the N+ source implant and the P+ base implant are carried out, and the second overlying oxide layer is then formed and etched to form sidewall spacers 161 and 162 in the device region 18. The depressions 170 and 171 are thereafter etched in the device region. Then, the third photoresist layer is deposited and patterned to form openings in the termination region 18, and the exposed portion of the first overlying oxide layer that is in this region is etched. Then, the titanium or tungsten is deposited and annealed to form the titanium or tungsten silicide plugs.

Thereafter, a contact metal, such as aluminum, is deposited over the surface of a device to fill in the openings in the overlying oxide and polysilicon layers and the openings in the silicon substrate atop the plugs, as shown in FIG. 8. Alternatively, when the titanium is omitted, the contact metal is deposited directly atop the depressions 170, 171. The silicide plugs 190, 191, when included, connect the N+ source regions to their respective underlying P+ base regions which are otherwise connected by the contact metal. A fourth photoresist layer is then deposited atop the aluminum and is patterned using a fourth, non-critical, photolithographic step. The aluminum layer is then etched to form gate bus 200 and source contact 201.

As a further alternative, solderable contact metal, such as a trimetal comprising layers of titanium, nickel and silver, is deposited over the surface of the device atop the aluminum layer. This solderable top metal is then patterned in the manner described above and forms gate bus 200 and source contact 201.

It should also be noted that, as yet a further alternative, the polysilicon layer 32 or 132 also includes polysilicon diodes. Here, the polysilicon layer is deposited and then doped with implanted arsenic or phosphorous, and then an additional photolithographic mask step defines diode regions in the polysilicon. The polysilicon diodes are then etched, and then the photoresist is removed. Then, an N+ arsenic implant is introduced into the entire remaining polysilicon layer. Then, the first overlying oxide layer is deposited atop the surface of the wafer, and the process continues in the manner described above.

Figure 9:
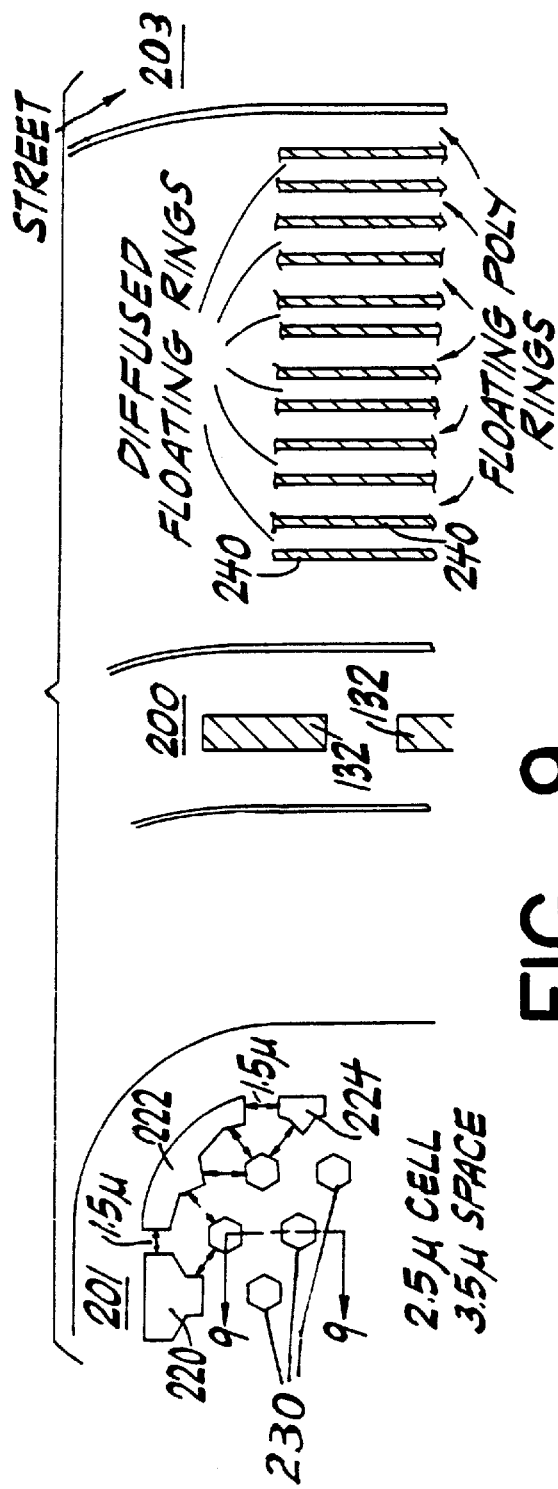
FIG. 9 shows a top view of the structure of FIG. 8.
Figure 10:
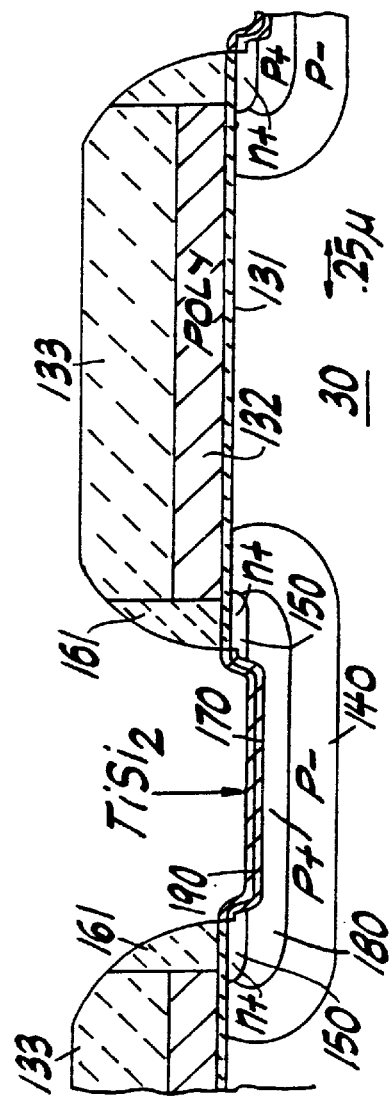
FIG. 10 shows an enlarged cross sectional view along section line 9—9 of FIG. 9.

FIG. 9 shows a top view of the device shown in cross-section in FIG. 8. The gate bus 200 is shown contacting portions of the polysilicon layer 132 that is located atop the field oxide. The source contact 201 is shown atop termination cells 220, 222 and 224 which, typically, have a 1.5 micron spacing. Also shown are device cells 230 which, typically, have a 2.5 micron cell size and a 3.5 micron spacing. A cross-sectional view of two of the cells is shown in FIG. 10.

FIG. 9 also shows portions of polysilicon rings 240 which are located atop the field oxide between the gate bus 201 and street 203. The polysilicon rings are held at a floating potential.

In accordance with the present invention, the density of the cells shown in FIG. 9 is greatly increased up to a density of about 20 million cells per square inch.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A process for fabricating a semiconductor device, said process comprising the steps of:

forming a layer of gate insulation material atop a silicon substrate of one conductivity type;

depositing a layer of polysilicon atop said layer of gate insulation material;

depositing a first overlaying insulation layer;

patterning and etching away selected regions of said first overlaying insulation layer to form a plurality of spaced openings therein which expose underlying regions of said layer of polysilicon;

etching away said underlying regions of said layer of polysilicon to form a further plurality of spaced openings therein;

introducing impurities of another conductivity type, which is of opposite conductivity type to said one conductivity type, into surface regions of said silicon substrate located beneath said further openings in said layer of polysilicon to form first diffused regions;

introducing impurities of said one conductivity type into said surface regions of said silicon substrate to form second diffused regions;

introducing impurities of said another conductivity type into said surface regions of said silicon substrate to form third diffused regions; said second diffused regions having a final depth that is less than that of said third diffused regions, said first diffused regions being deeper and wider than and having a lower concentration than that of said third diffused regions;

depositing a second overlaying insulation layer subsequent to forming said first, second, and third diffused regions;

etching away a portion of said second overlaying insulation layer that is atop said first overlaying insulation layer, thereby leaving a remaining portion of second overlaying insulation layer that forms vertical sidewall spacers along sidewalls in each of said openings in said first overlaying insulation layer and along sidewalls in each of said further openings in said layer of polysilicon and which exposes a portion of each of said surface regions of said silicon substrate;

etching depressions in said exposed portion of said surface regions of said silicon substrate using said vertical sidewall spacers as a mask, said depressions being etched to a depth greater than the depth of said second diffused regions;

depositing a contact conductive layer; and patterning and etching away portions of said contact conductive layer to form at least one source contact which contacts said second and third diffused regions and at least one gate contact.

2. The process of claim 1 further comprising the steps of: depositing another conductive layer prior to depositing said contact conductive layer; thermally treating said another conductive layer such that portions of said another conductive layer that contact said second and third diffused regions form a metal silicide layer that provides an electrical connection between said second and third diffused regions; and removing unreacted portions of said another conductive layer.

3. The process of claim 2 further comprising the step of patterning and etching away a portion of said vertical sidewall spacers of said second overlaying insulation layer and a portion of said first overlaying insulation layer prior to said step of depositing another conductive layer; and wherein said step of thermally treating said another conductive layer forms further portions of said metal silicide layer that contact said polysilicon layer and which provide an electrical connection between said polysilicon layer and said second and third diffused regions.

4. The process of claim 1 wherein said steps of introducing impurities of said one and another conductivity type includes implanting said impurities, into said silicon substrate through said layer of gate insulation material and then driving in said impurities.

5. The process of claim 1 wherein said one conductivity type is N-type and said another conductivity type is P-type.

6. The process of claim 1 wherein said first overlaying insulation layer comprises one of a thermally grown oxide, a low temperature oxide, a plasma enhanced chemical vapor deposited oxide, a plasma enhanced chemical vapor deposited TEOS and a furnace deposited TEOS.

7. The process of claim 1 wherein said second overlaying insulation layer comprises one of a furnace deposited TEOS layer, a low temperature oxide, a plasma enhanced chemical vapor deposited oxide and a plasma enhanced chemical vapor deposited TEOS.

8. The process of claim 2 wherein said another conductive layer is comprised of titanium.

9. The process of claim 2 wherein said step of thermally treating said another conductive layer includes rapid thermal annealing said another conductive layer at about 800° C.

10. The process of claim 2 wherein said step of thermally treating said another conductive layer includes rapid thermal annealing said another conductive layer at about 600° C. and then rapid thermal annealing said another conductive layer at about 800° C.

11. The process of claim 1 wherein said step of depositing a layer of polysilicon further includes the steps of patterning and etching away selected regions of said polysilicon layer to form polysilicon diodes and then introducing impurities of said one conductivity type into said polysilicon layer.

12. The process of claim 1 further comprising the steps of: forming a layer of field insulation material atop said silicon substrate; patterning and etching away at least one selected region of said layer of field insulation material to form at least one opening in said layer of field insulation material and at least one remaining portion; wherein said layer of gate insulation material is formed atop said silicon substrate in said at least one opening in said layer of field insulation material, said layer of polysilicon is formed atop said remaining portion of said layer of field insulation material and atop said layer of gate insulation material, said selected regions of said first overlaying insulation layer are etched away to form a plurality of first spaced openings therein which expose underlying regions of said layer of polysilicon which are atop said layer of gate insulation material and a plurality of second spaced openings which expose underlying regions of said layer of polysilicon which are atop said layer of field insulation material, said first underlying regions of said layer of polysilicon are further etched to form a further plurality of spaced openings therein, and said impurities of said another conductivity type are introduced into surface regions of said silicon substrate that are located beneath said further openings.

13. The process of claim 12 wherein said one conductivity type is N-type and said another conductivity type is P-type.

14. The process of claim 2 wherein said another conductive layer is comprised of tungsten.

15. The process of claim 1 wherein said step of depositing a contact conductive layer includes depositing a solderable contact metal atop said contact conductive layer.

16. The process of claim 15 wherein said solderable contact metal comprises a trimetal that includes respective layers of titanium, nickel and silver.

17. The process of claim 12 wherein said step of patterning and etching away portions of said contact conductive layer includes forming a gate bus which contacts a portion of said layer of polysilicon that is atop said layer of field insulation material.

18. The process of claim 17 wherein said layer of field insulation material includes a second opening that borders said semiconductor device and forms a street region, said layer of polysilicon includes at least one polysilicon ring located atop said layer of field insulation material between said gate bus and said street region and held at a floating potential.

19. The process of claim 1 wherein said third diffused regions are formed after said depressions are etched by introducing said impurities of said another conductivity type into said portion of said surface regions of silicon substrate.

20. The process of claim 2 wherein said another conductive layer is deposited atop only a portion of said second and third diffused regions.

* * * * *